United States Patent
Hase

(12)
(10) Patent No.: US 6,194,227 B1
(45) Date of Patent: Feb. 27, 2001

(54) METHOD OF PRODUCING A BISMUTH LAYER STRUCTURED FERROELECTRIC THIN FILM

(75) Inventor: Takashi Hase, Tokyo (JP)

(73) Assignees: Symetrix Corporation, Colorado Springs, CO (US); NEC Corporation (JP)

( * ) Notice: Subject to any disclaimer, the term of this patent is extended or adjusted under 35 U.S.C. 154(b) by 0 days.

(21) Appl. No.: 09/174,393

(22) Filed: Oct. 14, 1998

(30) Foreign Application Priority Data

Oct. 15, 1997 (JP) .................................................... 9-281531

(51) Int. Cl.⁷ ...................... H01L 21/00; H01L 21/8242; H01L 21/20

(52) U.S. Cl. .............................. 438/3; 438/239; 438/256; 438/386; 438/399; 427/100; 427/372.2; 427/376.2

(58) Field of Search .............................. 438/3, 239, 256, 438/386, 399; 427/100, 126.1, 126.3, 372.2, 376.2

(56) References Cited

U.S. PATENT DOCUMENTS

| | | |
|---|---|---|
| 5,426,075 | 6/1995 | Perino et al. . |
| 5,434,102 | 7/1995 | Watanabe et al. . |
| 5,468,679 | 11/1995 | Paz de Araujo et al. . |
| 5,519,234 | 5/1996 | Paz de Araujo et al. . |
| 5,784,310 | 7/1998 | Cuchiaro et al. . |
| 5,824,590 | * 10/1998 | New ...................................... 438/393 |
| 5,833,745 | * 11/1998 | Atsuki et al. .................... 106/287.18 |
| 5,902,639 | * 5/1999 | Glassman et al. ................. 427/248.1 |

FOREIGN PATENT DOCUMENTS

| | | |
|---|---|---|
| 0 661 754 A2 | 7/1995 | (EP) . |
| 09142845 | 6/1997 | (JP) . |

OTHER PUBLICATIONS

Hu et al., "Effects of a Bi4Ti3O12 buffer layer on SrBi2Ta2O9 thin films prepared by the metal organic solution deposition technique," International Symposium on Application of Ferroelectrics, p. 1–4 (Aug. 24, 1998).

Hironaka et al., "SrBi2Ta29 Thin Films Formed by Flash–MOCVD," p. 15–20. Nov., 1995.

Watanabe et al., "Preparation of Ferroelectric Thin Films of Bismuth Layer Structured Compounds," Jpn. J. Appl. Phys., vol. 34, Part 1, No. 9B, p. 5240–5244 (Sep. 1995).

* cited by examiner

Primary Examiner—John F. Niebling
Assistant Examiner—Alexander G. Ghyka
(74) Attorney, Agent, or Firm—Duft, Graziano & Forest, P.C.

(57) ABSTRACT

The surface of a Si substrate is coated with a lower electrode of precious metal (Pt), then a buffer layer comprising an oxide thin film containing Bi is deposited. On the surface of the buffer layer, a thin film of a Bi layer structured ferroelectric substance is formed. Thus, reaction of the Bi layer structured ferroelectric substance with the precious metal coating the Si substrate is avoided during crystallization carried out at a low temperature. Therefore, deviation in composition of the thin film thus formed is suppressed to provide the thin film with a high density. When the thickness of the buffer layer is not greater than five percent of that of the Bi layer structured ferroelectric thin film, electrical characteristics of a capacitor are not deteriorated. When electrical connection is conducted by polycrystalline Si, production of oxide can be avoided by deposition at 650° C.

9 Claims, 6 Drawing Sheets

METHOD OF PRODUCING A BISMUTH LAYER STRUCTURED FERROELECTRIC THIN FILM

BACKGROUND OF THE INVENTION

1. Field of the Invention

The present invention relates to a method of producing, on a substrate, a ferroelectric thin film of a bismuth layer structure, namely, a bismuth (hereinafter "Bi") layer structured ferroelectric thin film represented by $(Bi_2O_2)^{2+}(A_mB_nO_l)^{2-}$ and, in particular, to a method of producing a Bi layer structured ferroelectric thin film which is capable of compensating and suppressing deviation in composition of the Bi layer structured ferroelectric thin film and which is capable of suppressing degradation in electrical characteristics.

2. Statement of the Problem

Generally, various growing methods, such as organic metal solution coating, chemical vapor deposition (hereinafter CVD), and laser ablation, are known as methods of producing a Bi layer structured ferroelectric thin film. Substrates used therein are typically Si (silicon) substrates having an oxidized surface and a thin layer of high-melting-point precious metal, such as Pt (platinum) or Ir (iridium) deposited on the oxidized Si wafer, or having an oxidized Si layer, a thin film of high-melting-point precious metal, and an appropriate adhesive layer interposed therebetween.

As exemplified in FIG. 11, a conventional method of producing a Bi layer structured ferroelectric thin film directly forms a Bi layer structured ferroelectric thin film 6 on the upper surface of a lower electrode 4 of Pt which overlies an adhesive layer 3 of Ti (titanium) deposited on a Si oxide layer 2.

A typical method for obtaining excellent ferroelectric characteristics in the above-mentioned process is to heat the substrate at a temperature not lower than 750° C. during or after growth of the thin film.

For instance, as described by Watanabe, et. al., in an article entitled "Preparation of Ferroelectric Thin Films of Bismuth Layer Structured Compounds" (Journal of Applied Physics, Volume 34 (1995), Part 1, No. 9B, pp. 5240–5244), organic metal solution is coated and thereafter fired in an oxygen atmosphere at a temperature of 800° C. in a metal-organic decomposition (hereinafter "MOD") method.

Besides, as described by Hironaka, et. al., in an article entitled "Formation of $SrBi_2Ta_2O_9$ Thin Films by Flash-MOCVD" (Applied Electronics, Technical Meeting on Physical Properties, Nov. 22, 1995, pp. 15–20), thin films are deposited on a substrate by CVD and thereafter post-annealed in an oxygen atmosphere at a temperature of 800° C. in a manner similar to that described above.

In some of the above-mentioned conventional methods of producing a Bi layer structured ferroelectric thin film, the thin films deposited are often subjected to heat treatment to be crystallized. In this case, the resultant Bi layer structured ferroelectric thin film is composed of granular grains and often undesirably includes voids or pores within the thin film. This brings about a problem that the insulation characteristic of the thin film is degraded as compared with other types of ferroelectric thin films.

In addition, the annealing temperature of the Bi layer structured ferroelectric thin film is not lower than 750° C. This results in problems, such as an interdiffusion between Bi used as a constituent element of the ferroelectric thin film and the precious metal used as the lower electrode, an adhesive layer, or the oxidized Si layer, and it spoils the flatness of the substrate. If device elements are formed in the Si substrate, their characteristics may be degraded due to the interdiffusion.

Consideration will be given to the case where a capacitor is formed by the use of a Bi layer structured ferroelectric thin film and is electrically connected to the device element formed in the Si substrate by a polycrystalline Si plug. In this case, the surface of the polycrystalline Si is oxidized by the heat treatment in the oxygen atmosphere at the temperature not lower than 750° C. Such oxidization of the surface of the polycrystalline Si makes an electrical connection impossible.

3. Solution to the Problem

In order to solve the above-mentioned problems, it is an object of the present invention to provide a method of producing a Bi layer structured ferroelectric thin film which is capable of compensating and suppressing deviation in composition of the Bi layer structured ferroelectric thin film, suppressing degradation in electrical characteristics, and achieving a good electrical connection.

A feature of the invention is a method of producing a Bi layer structured ferroelectric thin film comprising steps of: providing a substrate; forming a buffer layer of an oxide film containing Bi (bismuth) on the substrate; and forming a thin film of a Bi layer structured ferroelectric substance, where the Bi layer structured ferroelectric substance is represented by a chemical formula $(Bi_2O_2)^{2+}(A_mB_nO_l)^{2-}$.

Another feature of the invention is applying a coating of a solution for forming the Bi layer structured ferroelectric substance onto the buffer layer, and then annealing the coating to form the Bi layer structured ferroelectric thin film.

Another feature of the invention is a buffer layer having a thickness not greater than about five percent of a total combined thickness of a layer structure containing the Bi layer structured ferroelectric thin film and the buffer layer.

Another feature of the invention is a preparation temperature of the buffer layer that is lower than a preparation temperature of the Bi layer structured ferroelectric thin film. Preferably, a preparation temperature of the Bi layer structured ferroelectric thin film is not higher than about 650° C.

Another feature of the inventions is a Bi layer structured ferroelectric substance containing constituent elements A and B as represented in the chemical formula $(Bi_2O_2)^{2+}(A_mB_nO_l)^{2-}$, wherein the buffer layer is represented by a chemical formula selected from the group consisting of "$A_xBi_yO_z$" or "$B_xBi_yO_z$" and the buffer layer contains only the constituent elements of the Bi layer structured ferroelectric substance.

Another feature of the invention is a thin film of a Bi layer structured ferroelectric substance containing constituent elements A and B as represented in the chemical formula $(Bi_2O_2)^{2+}(A_mB_nO_l)^{2-}$, whereby the constituent element A is selected from a group consisting of a combination of Sr (strontium) and Ba (barium) and a combination of Sr and Pb (lead), and the constituent element B is at least one selected from the group consisting of Ta (tantalum) and Nb (niobium), and whereby the buffer layer of an oxide thin film comprises a Bi layer structured ferroelectric substance containing both of said constituent elements A and B.

Numerous other features, objects and advantages of the invention will become apparent from the following description when read in conjunction with the accompanying drawings.

DETAILED DESCRIPTION OF THE PREFERRED EMBODIMENT

1. Overview

Figure 1:
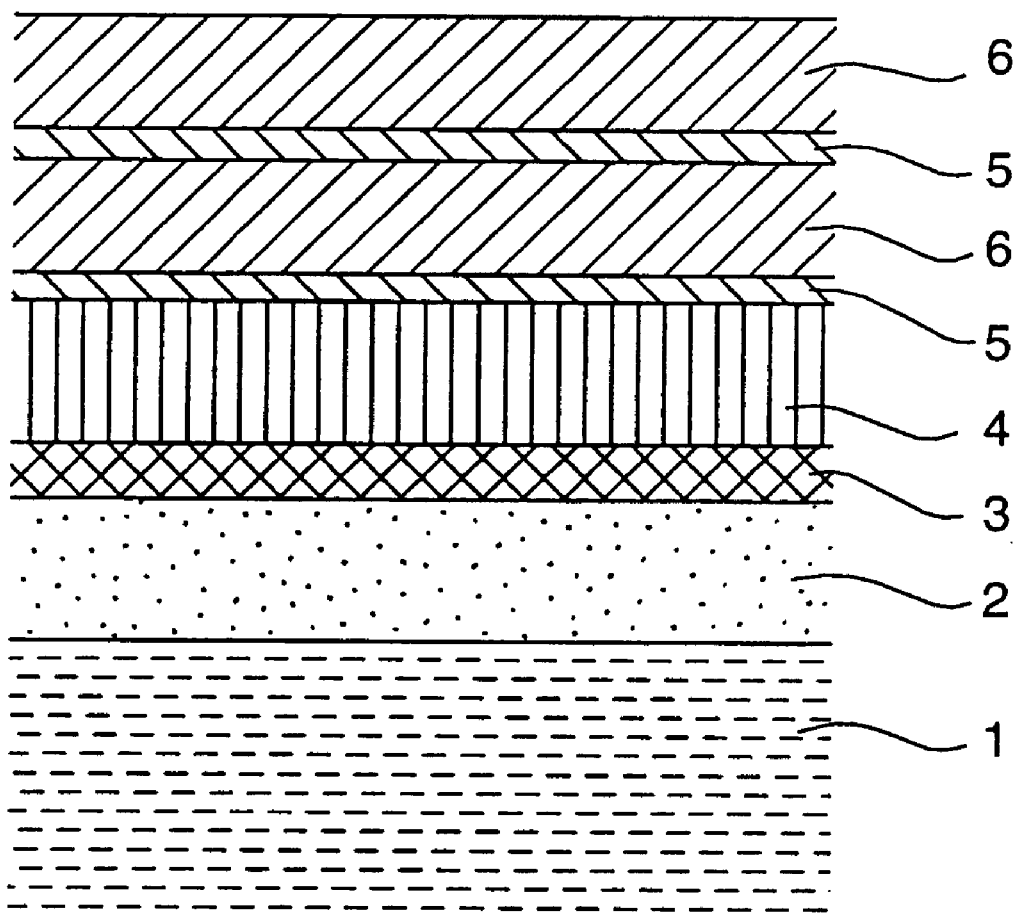
FIG. 1 is a sectional view for describing preparation of a thin film according to one embodiment of the present invention.

It should be understood that the FIGS. 1, 8–10 depicting ferroelectric integrated circuit sections are not meant to be actual cross-sectional views of any particular portion of an actual integrated circuit device. In the actual devices, the layers will not be as regular and their thicknesses may have different proportions. The various layers in actual devices often are curved and possess overlapping edges. The figures instead show idealized representations which are employed to depict more clearly and fully the method of the invention than would otherwise be possible. Likewise, other integrated circuits fabricated using the method of the invention could include other elements and compositions of material.

According to the present invention, a method of producing a Bi layer structured ferroelectric thin film which is represented by $(Bi_2O_2)^{2+}(A_mB_nO_l)^{2-}$ comprises the step of forming, on a substrate, a buffer layer composed of an oxide thin film containing Bi (bismuth). In cases where the method comprises the steps of repeatedly applying a Bi layer structured ferroelectric substance onto the substrate by solution coating and annealing the substance to form the Bi layer structured ferroelectric thin film, an additional step may be included to form the buffer layer composed of an oxide thin film containing Bi (bismuth) on the substrate prior to at least one of the solution-applying steps.

With the above-mentioned structure, crystallization of the thin film progresses from nucleation sites on the surface of a buffer layer composed of an oxide thin film formed in an inner portion adjacent to the substrate. This eliminates occurrence of the voids arising from formation of grains that crystallize from random positions. In addition, Bi included in the buffer layer serves to compensate a reduction of an amount of Bi that is caused to occur as a result of reaction with an underlying electrode, with an interior adhesive layer, or with the Si oxidized layer during crystallization of the Bi layer structured ferroelectric substance.

It is preferable that a total thickness of the buffer layer comprising at least one layer is not greater than about five percent of a total thickness of the Bi layer structured ferroelectric thin film and the buffer layer. When the thin film of the above-mentioned structure is used as a capacitor, degradation in electrical characteristics caused by insertion of the buffer layer can be suppressed to a minimum.

Furthermore, it is preferred that a preparation temperature of the buffer layer is lower than that of the Bi layer structured ferroelectric thin film. By crystallizing the buffer layer at a temperature lower than that of the Bi layer structured ferroelectric thin film as described above, it is possible to prevent Bi from diffusing outside of the buffer layer. In addition, the crystallized buffer layer inhibits Bi from diffusing outside during subsequent heat treatment at a higher temperature. Therefore, crystallization of the Bi layer structured ferroelectric substance can be achieved without degradation of flatness and characteristics of the lower electrode, the adhesive layer, and the Si oxidized film due to reaction with Bi. In this case also, the buffer layer serves to provide nucleation sites of crystallization and, therefore, to lower crystallization temperature and to suppress deviation in composition of the Bi layer structured ferroelectrics.

It is preferable that a preparation temperature of the Bi layer structured ferroelectric thin film is not higher than about 650° C. When the preparation temperature is not higher than 650° C., it is possible to avoid failure of electrical connection resulting from oxidization of polycrystalline Si by depositing titanium nitride (TiN) on the polycrystalline Si as a diffusion barrier layer against oxygen.

It is preferable that the buffer layer be represented by "$A_xBi_yO_z$" or "$B_xBi_yO_z$", which only contain constituent elements included in the Bi layer structured ferroelectrics that are essential components of the Bi layer structured ferroelectric thin film, whereby constituent element A of the Bi layer structured ferroelectric substance is either at least one of Sr (strontium) and Ba (barium) or at least one of Sr and Pb (lead), while the element B is at least one of Ta (tantalum) and Nb (niobium).

As described above, the constituent elements of the buffer layer include some of the constituent elements of the Bi layer structured ferroelectric substance. With this structure, similarity in composition and crystalline structure between the buffer layer and the Bi layer structured ferroelectric thin film is increased and crystallization energy is lowered. In addition, when the buffer layer is extremely thin in comparison with the Bi layer structured ferroelectric thin film and an appropriate composition of the Bi layer structured ferroelectric thin film is slightly excessive, most of the buffer layer can be crystallized into the Bi layer structured ferroelectric thin film after the role of the buffer layer is finished. In this event, degradation in electric characteristics of a capacitor can be avoided.

2. Detailed Description

Next, description will be made in detail as regards embodiments of the present invention by reference to the figures.

FIG. 1 is a sectional view for use in describing production of a Bi layer structured ferroelectric thin film according to one embodiment of the present invention. As shown in FIG. 1, a substrate to be used comprises a Si substrate 1, a silicon oxide 2 layer of $SiO_2$ formed by thermally oxidizing its surface, a lower electrode adhesive layer 3 of Ti on the silicon oxide layer, and a lower electrode 4 of Pt deposited by DC sputtering. Thus, an underlying base of the Bi layer structured ferroelectric thin film is formed on the surface.

In order to form the Bi layer structured ferroelectric thin film on the above-mentioned surface, an oxide buffer layer 5 containing Bi is at first formed. Then, a Bi layer structured ferroelectric substance 6 is stacked on the surface of the buffer layer 5 to form the Bi layer structured ferroelectric thin film. In case of FIG. 1, a two-layered structure of the Bi layer structured ferroelectric thin film is formed by an additional step of stacking the Bi layer structured ferroelectric substance 6 on the surface of the buffer layer 5. In this production process, a necessary heat treatment is carried out at a temperature not higher than 600° C. or 700° C. Such a heat treatment serves to avoid degradation of characteristics in a device element in the Si substrate 1 due to a high temperature. In addition, the Bi layer structured ferroelectric layer 6 is processed in contact with the surface of the oxide buffer layer 5 containing Bi. As a result, deviation in Bi composition can be avoided within the Bi layer structured ferroelectric thin film thus produced.

EXAMPLE 1

Now, a first embodiment of the present invention will be described in detail with reference to FIG. 1.

As mentioned above, a substrate to be used comprises the Si substrate 1, the silicon oxide 2 layer of "$SiO_2$" formed by thermally oxidizing its surface, the lower electrode adhesive layer 3 of Ti on the silicon oxide layer, and the lower electrode 4 of Pt deposited by DC sputtering.

The following description will be directed to the case of forming the Bi layer structured ferroelectric thin film. In order form the Bi layer structured ferroelectric thin film on the above-mentioned surface, "$Sr_3Bi_2O_6$" (hereinafter "SBO") is first formed by a MOD ("Metal-Organic Decomposition") method as the oxide buffer layer 5 containing Bi. Then, "$SrBi_2Ta_2O_9$" (hereinafter "SBT") is formed by the MOD method as the Bi layer structured ferroelectric substance 6 on the surface of the buffer layer 5.

At a first step, in order to form the buffer layer 5 of SBO, Sr and Bi as organic metal materials are mixed together at a stoichiometric ratio of SBO. The mixed materials are dissolved by an appropriate organic solvent to form the solution. As the organic metal materials containing Sr and Bi, alkoxide and organic salt can be used, for example. As the solvent, use may be made of, for instance, 1-methoxy-2-propanol, organic acid, and xylene.

In this example, diisopropoxystrontium and bismuth 2-ethylhexanoate were used as the organic metal materials. As the solvent, 2-ethylhexanoic acid and xylene were used. After each of the above-mentioned materials was weighed, these materials were circulated in a dry nitrogen atmosphere at 120° C. for one hour. Thus, a coating solution having a concentration of 0.13 mol/kg was obtained.

At a next step, this solution was applied on the above-mentioned substrate by a spin coater of 1500 rpm, followed by necessary heat treatments. All of these heat treatments were carried out in an oxygen atmosphere. Specifically, drying of the solvent at 250° C. for ten minutes, decomposition and removal of organic components at 400° C. for ten minutes, and then crystallization annealing at 600° C. or 700° C. for one hour were successively carried out.

Figure 2:
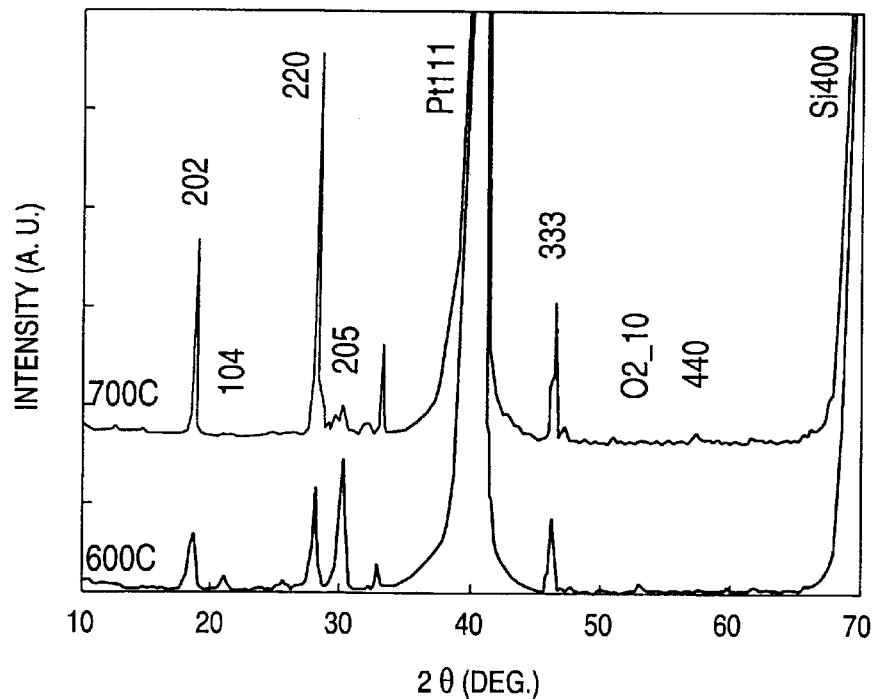
FIG. 2 is a graph showing X-ray diffraction patterns of the SBO buffer layer according to one embodiment of the present invention.

FIG. 2 shows X-ray diffraction patterns of the SBO buffer layer after completion of the above-mentioned crystallization annealing. The indexed peaks illustrated in the figure may be considered from their positions as occurrence of crystallization of SBO. It is understood that SBO is crystallized by the heat treatment at 600° C. or 700° C.

A subsequent step is to form a thin film by the Bi layer structured ferroelectric substance 6. A coating solution to form an SBT thin film is prepared by the use of, for example, alkoxide or organic salt as the organic metal materials of Sr, Bi, and Ta along with the solvent, such as 1-methoxy-2-propanol, organic acid, and xylene.

Diisopropoxy strontium, pentaethyoxy tantalum, and bismuth 2-ethylhexanoate were used as the organic metal materials. As the solvent, 2-ethylhexanoic acid and xylene were used. After each of the above-mentioned materials was weighed, these materials were circulated in a dry nitrogen atmosphere at 120° C. for one hour. Thus, a coating solution having a concentration of 0.13 mol/kg was obtained.

At a next step, this solution was applied on the above-mentioned substrate by a spin coater of 1500 rpm, followed by necessary heat treatments. All of these heat treatments were carried out in oxygen. Specifically, drying of the solvent at 250° C. for ten minutes, decomposition and removal of organic components at 650° C. for one hour, and then crystallization annealing at 650° C. for one hour were successively carried out.

In the above-mentioned sequence of steps, it is possible to form the SBT thin film with a thickness of 90–100 nm. In order to increase the thickness, the above-mentioned sequence of steps were again repeated in a manner depicted in FIG. 1 to accomplish the final thickness of about 250 nm.

In order to further increase the thickness, the application and annealing processes of the SBO thin film as the buffer layer 5, and the application and annealing processes of the SBT thin film of the Bi layer structured ferroelectric substance 6 may be repeated a plurality of times until a desired thickness is achieved. In this manner, each time when the SBT thin film layer is formed, the SBO buffer layer 5 is formed prior to formation of the SBT thin film layer. Thus, an effective influence of each SBO buffer layer 5 is given to each SBT thin film layer.

Figure 3:
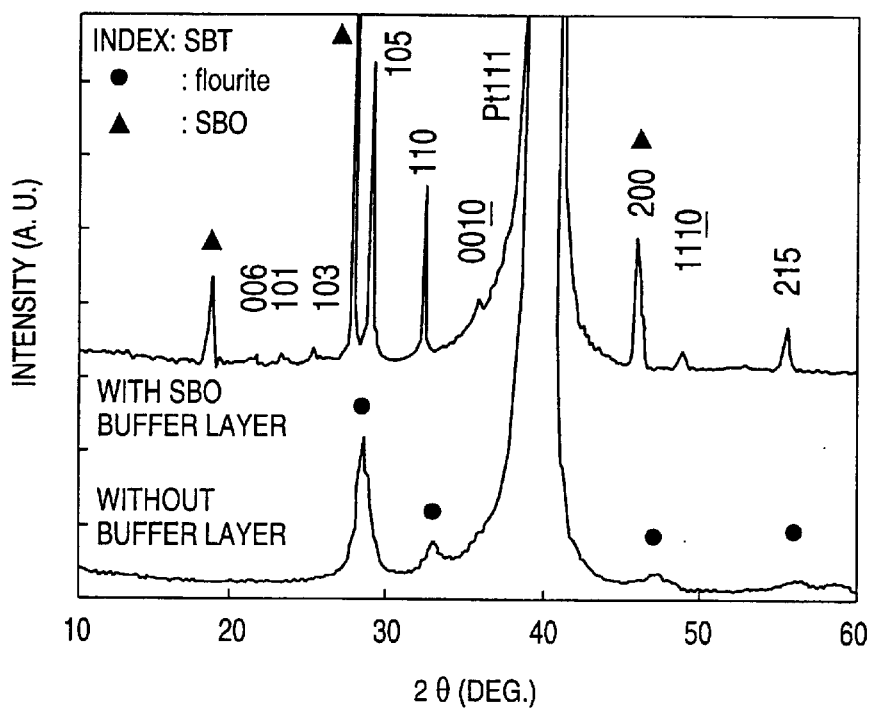
FIG. 3 is a graph comparing one example of X-ray diffraction patterns of the SBT thin film according to the present invention with one example of X-ray diffraction patterns of the SBT thin film produced without the SBO buffer layer.

FIG. 3 shows an X-ray diffraction pattern of the SBT thin film obtained by the above-mentioned steps and that of the SBT thin film produced without the SBO buffer layer. As shown in this figure, a peak which may specify a fluorite phase is observed when the SBO buffer is absent. However, this phase is a paraelectric phase and does not exhibit ferroelectric characteristics. No peak is observed at the position corresponding to SBT of a Bi layer structured perovskite structure which has ferroelectricity. Therefore, a ferroelectric thin film is not obtained as desired. On the other hand, when the SBO buffer layer is inserted, a peak is observed at the position corresponding to SBT of the Bi layer structured perovskite structure, which is a ferroelectric phase. It is, therefore, understood that the goal of a ferroelectric thin film can be obtained.

From the above-mentioned experimental results, it is obvious that the SBO buffer layer enhances the production of the Bi layer structured perovskite phase as the ferroelectric phase of the SBT. However, because a thickness ratio of the SBO buffer layer and the SBT thin film is as large as 60 nm/200 nm (=0.3), and a relative dielectric constant (about 15) of SBO as a paraelectric material is small as compared with SBT, residual polarization representative of ferroelectricity was not observed when an electrode was formed on the SBT.

The structure of the crystal grain of the SBT thin film thus produced can be described as follows. In the SBT thin film on the SRO buffer layer, columnar grains (crystalline state) having a grain size of about 0.1–0.2 $\mu$m were uniformly produced throughout the film surface. In comparison with the SBT thin film having no buffer layer and produced at a temperature not lower than 750° C., it is confirmed that voids within the thin film are decreased.

EXAMPLE 2

A second example will be described here with reference to FIG. 1. The concentration of the coating solution for the SBO buffer layer 5 was changed from 0.13 mol/kg of Example 1 to 0.02 mol/kg, and annealing for crystallization was carried out at 700° C. As a result, a SBO thin film having a thickness of about two nm was obtained as the buffer layer 5.

Figure 4:
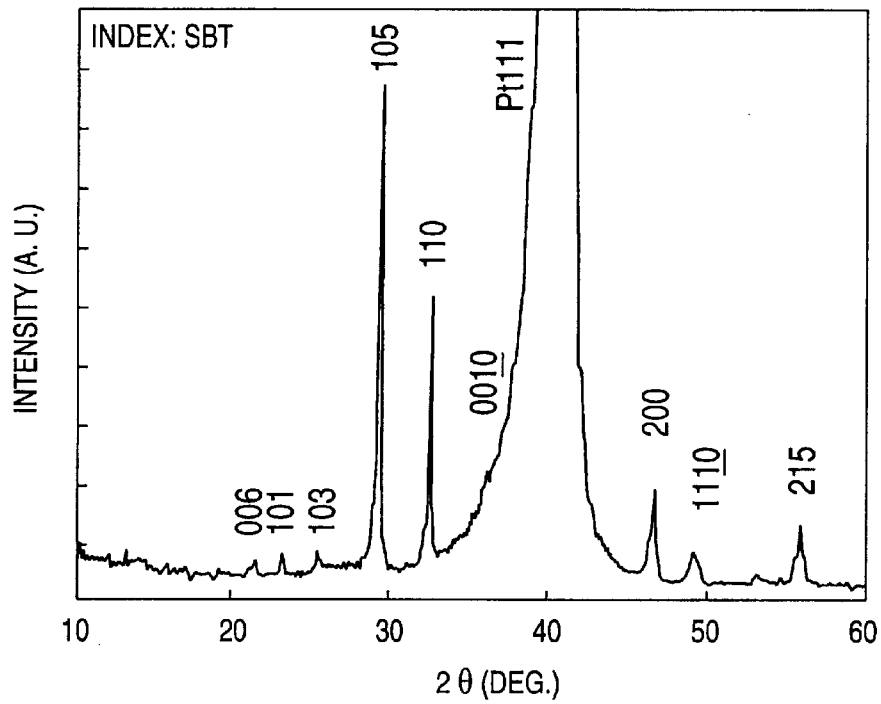
FIG. 4 is a graph showing one example of an X-ray diffraction pattern of the SBT thin film according to the present invention.

FIG. 4 shows an X-ray diffraction pattern when the SBT thin film was produced on the SBO buffer layer 5 in a manner similar to that described in Example 1.

As illustrated in the figure, even though the total thickness of the SBO buffer layer of this example is as small as about 4 nm, the SBT thin film of the Bi layer structured perovskite structure is crystallized like in the above-mentioned first example. Thus, it is obvious that the crystallization of the Bi layer structured perovskite phase of the SBT thin film is enhanced.

Figure 5:
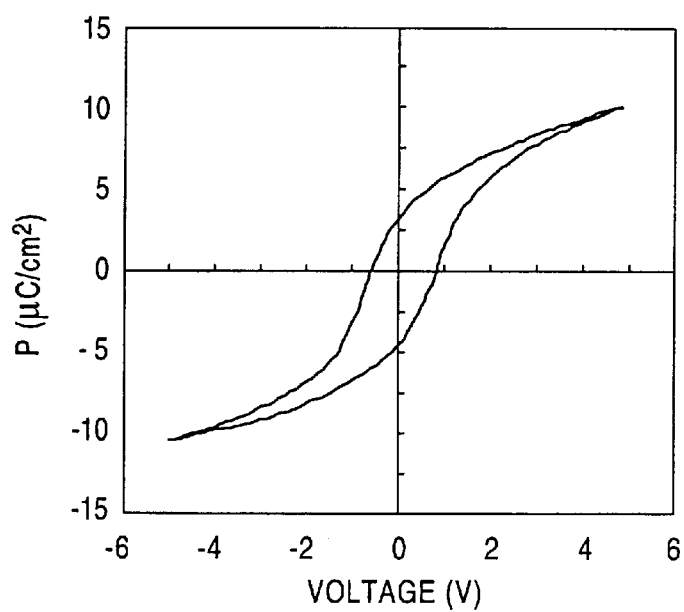
FIG. 5 is P-E hysteresis curve of the thin film layer by the thin film process according to the present invention.

FIG. 5 shows a typical P-E hysteresis curve obtained when electrodes are formed on the surface of the thin film thus obtained and a sine wave of ±5 volts is applied therebetween. As shown in Table 1 below, a thickness ratio of the SBO buffer layer and the SBT thin film is as small as 4 nm/200 nm (=0.02). Therefore, only a slight influence is given to the electrical characteristics by the SBO buffer layer having a small relative dielectric constant. Thus, a hysteresis showing ferroelectric characteristics can be clearly observed. From the result of the measurement, a residual polarization value of this sample is obtained as 4.2 $\mu C/cm^2$.

The crystal grain structure of the SBT thin film was not different from that of Example 1, in which the thickness of the SBO buffer layer was about 60 nm. It is noted that the leakage current density was reduced in comparison with that of the SBT thin film without the SBO buffer layer, listed under "Ref" in Table 1.

EXAMPLE 3

A third example is described here with reference to FIG. 1. Annealing for crystallization was carried out at 600° C., instead of 700° C. as in Example 2, and the concentration of the coating solution for the SBO buffer layer 5 was equal to 0.02 mol/kg. As a result, the SBO thin film obtained as the buffer layer 5 had a thickness of about two nm, as in Example 2.

When the SBT thin film was formed on the SBO buffer layer in the manner similar to that described in Example 1, the SBT thin film of the Bi layer structured perovskite structure was crystallized as in Example 2. It is, therefore, obvious that the crystallization of the BI layer structured perovskite phase of the SBT thin film was enhanced.

Figure 6:
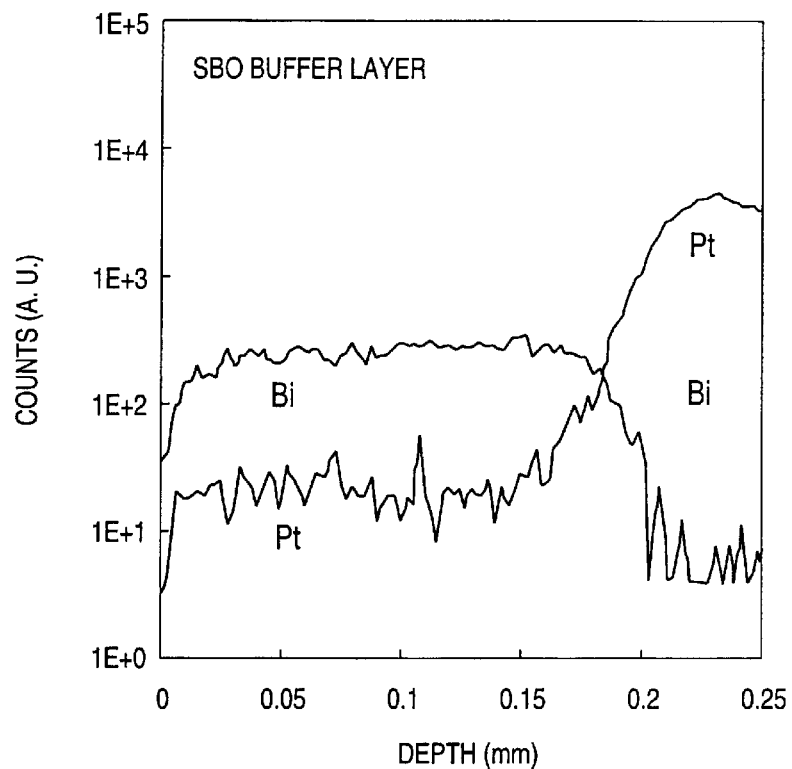
FIG. 6 is a graph showing the depth profile of the composition of an SBT thin film structure produced by the thin film process of the present invention.
Figure 7:
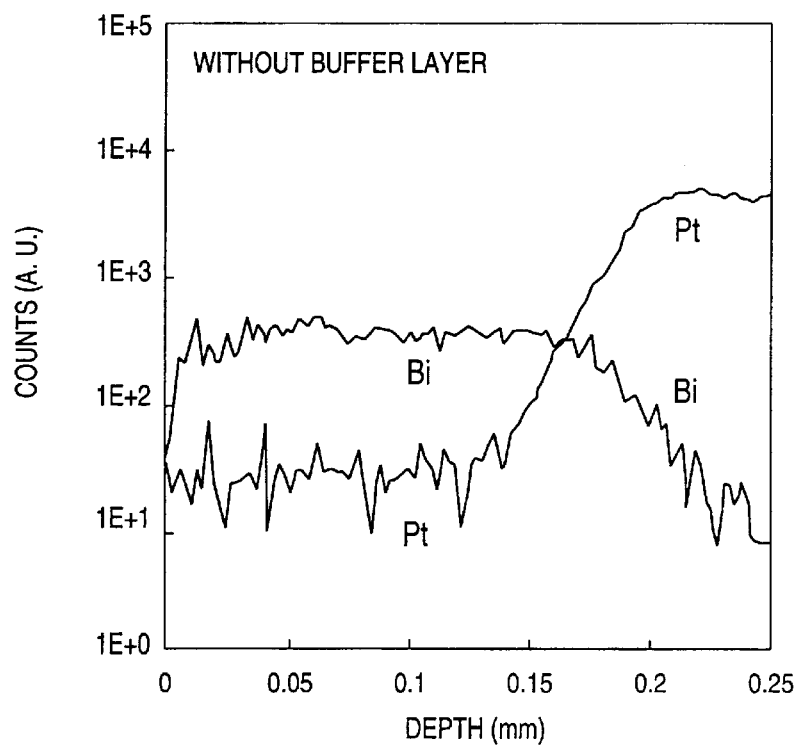
FIG. 7 is a graph showing the depth profile of the composition of an SBT thin film structure formed on a Pt substrate at 800° C. by a conventional method.

FIGS. 6 and 7 show analysis results of the composition in depth direction in the SBT thin film structure with the SBO buffer layer produced in this example and in the SBT thin film structure formed on a Pt substrate at 800° C. by a conventional method, respectively.

In the structure produced by the method based on this example shown in FIG. 6, a boundary surface between the Pt surface of the substrate and the SBT thin film composed of the ferroelectric substance and the buffer layer is sharp, and no substantial diffusion of Bi into Pt is observed. On the other hand, in the conventional method without the buffer layer, shown in FIG. 7, diffusion of Bi into the Pt layer is observed. From the results of the composition analysis, the SBO buffer layer did not remain as a distinct layer.

As shown in Table 1 below, the sample had a residual polarization of 4.0 $\mu C/cm^2$ measured at five volts. Although the residual polarization value is lower as compared with the case where the crystallization annealing of the SBO buffer layer was carried out at a temperature of 700° C., it is obvious that the SBT thin film produced by the method of this example exhibits ferroelectricity. Besides, the crystal grain structure of the SBT thin film is substantially identical with that of Example 1, in which the SBO buffer layer had a thickness of 60 nm.

EXAMPLE 4

Figure 8:
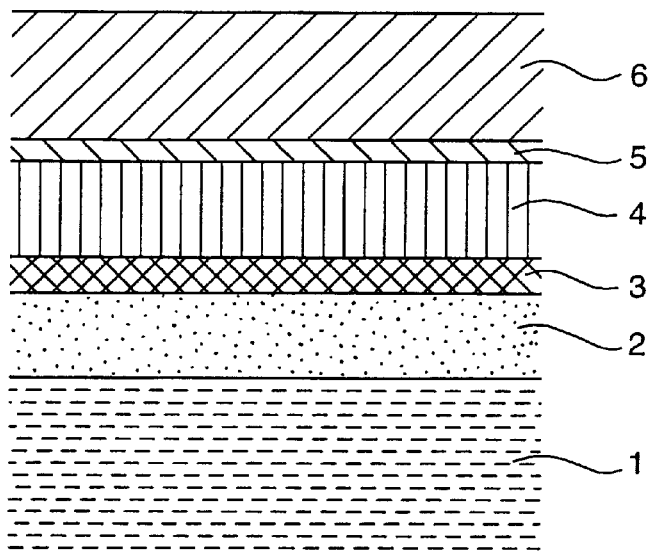
FIG. 8 is a sectional view for describing production of the SBT thin film of FIG. 1 by sputtering according to one embodiment of the present invention.

A fourth example will be described here with reference to FIG. 8. In this example, the Bi layer structured ferroelectric substance 6 is formed by RF ("radio frequency") magnetron sputtering on the substrate, after formation of the SBO buffer layer 5 thereon by the MOD method, as described in Example 3.

A target comprised ceramics having a composition of "Sr/Bi/Ta=1/2.5/2" in mole ratio. Typical sputtering conditions were: RF power of 500 W, gas pressure of 40 mTorr, gas composition ratio of "Ar/$O_2$=9/1", and no heating of the substrate. Under these conditions, an SBT thin film of about 200 nm was formed. After deposition of the film, post-annealing was carried out at 650° C. for one hour in an oxygen atmosphere.

In the SBT thin film produced by sputtering, the entire thin film can be crystallized at once, unlike the production by the MOD method. Therefore, as shown in FIG. 8, the SBO buffer layer 5 was able to be applied and baked only once on Pt formed on the substrate as the lower electrode 4. Therefore, the total thickness of the SBO buffer layer 5 was about two nm.

The thin film obtained in this example had a residual polarization value of 5.1 $\mu C/cm^2$. Thus, the ferroelectricity is clearly improved in comparison with the residual polarization value of 0.5 $\mu C/cm^2$ entered in Table 1 under "Ref" for the SBT thin film formed by MOD without the SBO buffer layer.

EXAMPLE 5

In this fifth example, "$Bi_4Ti_3O_{12}$" (hereinafter "BIT") is used as the oxide buffer layer 5 containing Bi shown in FIG. 1. BIT is a type of Bi layer structured ferroelectrics.

The Bi layer structured ferroelectric thin film was formed by MOD using BIT and SBT as the buffer layer 5 and the Bi layer structured ferroelectric substance 6, respectively.

First, Ti and Bi as organic metal materials mixed in a stoichiometric composition of BIT were dissolved by an appropriate organic solvent to form the BIT solution. As the organic metal materials comprising Ti and Bi, for example, alkoxide and organic salt can be used. As the solvent, use may be made of, for instance, 1-methoxy-2-propanol, organic acid and xylene.

In the BIT solution of this example, tetraisopropoxy titanium and bismuth 2-ethylhexanoate were used as organic metal materials, while 2-ethylhexanoic acid and xylene were used as solvents.

After each of the materials was weighed, these materials were circulated in a dry nitrogen atmosphere at 120° C. for one hour. Thus, a coating solution having a concentration of 0.013 mol/kg was obtained.

This solution was applied as the buffer layer 5 on Pt formed as the lower electrode 4 of the substrate in FIG. 1 by a spin coater rotated at 1500 rpm, followed by necessary heat treatments. All of these heat treatments were carried out in an oxygen atmosphere. Specifically, drying of the solvent at 250° C. for ten minutes, decomposition and removal of organic components at 400° C. for ten minutes, and then crystallization annealing at 600° C. for one hour were successively carried out. The resulting BIT buffer layer 5 was about seven nm thick.

The SBT thin film was formed in a manner similar to that described in Example 1. This process was repeated twice together with the BIT deposition process. As a result, the BIT buffer layer had a total thickness of about 14 nm and the layer structure had a total thickness of about 210 nm.

As listed in Table 1, the capacitor had a residual polarization value of 4.5 $\mu C/cm^2$. Therefore, it is obvious that the BIT buffer layer functions to enhance the crystallization of the Bi layer structured perovskite phase of the SBT, like the SBO buffer layer. Because the BIT buffer layer has a crystalline Bi layer structured perovskite structure as in SBT, the crystalline structure of the BIT is similar to that of the SBT and is also helpful to enhance the crystallization of SBT.

In case of the BIT buffer layer, the relative dielectric constant (120–140) is greater than that of the SBO buffer layer. Therefore, the ferroelectricity of the layer structure is not degraded, even if the thickness of the buffer layer becomes thick. Moreover, the SBT thin film is composed of uniform and fine columnar grains having a diameter of about 0.1–0.2 $\mu m$.

EXAMPLE 6

In this sixth example, the BIT buffer layer 5 is formed by RF magnetron sputtering on Pt formed as the lower electrode 4 of the substrate of FIG. 1, as described in Example 5.

With respect to the BIT buffer layer, typical sputtering conditions are: a sputter target composition ratio of "Bi/Ti= 1/1"; RF power of 250 W; gas pressure of 40 mTorr; gas composition ratio of "Ar/$O_2$=9/1"; and no heating of the substrate. Under these conditions, by carrying out the crystallization annealing at 600° C. for one hour after sputtering, a BIT buffer layer with a thickness of five nm was formed.

The Bi layer structured ferroelectric thin film was formed by depositing the Bi layer structured ferroelectric substance 6 on the BIT buffer layer 5 of FIG. 1 using the MOD method. The production conditions are the same as in Example 1.

In this case, the process of producing the BIT buffer layer and the process of producing the Bi layer structured ferroelectric thin film using the MOD method with heat treatment for SBT crystallization were carried out twice. The BIT buffer layer measured had a total thickness of about ten nm, while the layer structure measured a total thickness of about 210 nm.

As shown in Table 1, under Example 6, the capacitor had a residual polarization value of 4.0 $\mu C/cm^2$. Therefore, it is obvious that the BIT buffer layer formed by sputtering functions to enhance the crystallization of the Bi layer structured perovskite phase in the SBT thin film, similar to the BIT buffer layer formed by MOD. The crystal grain structure of the SBT thin film is similar to that of the SBT thin film on the BIT buffer layer formed by MOD, except that the crystal grain size is slightly smaller.

EXAMPLE 7

Figure 9:
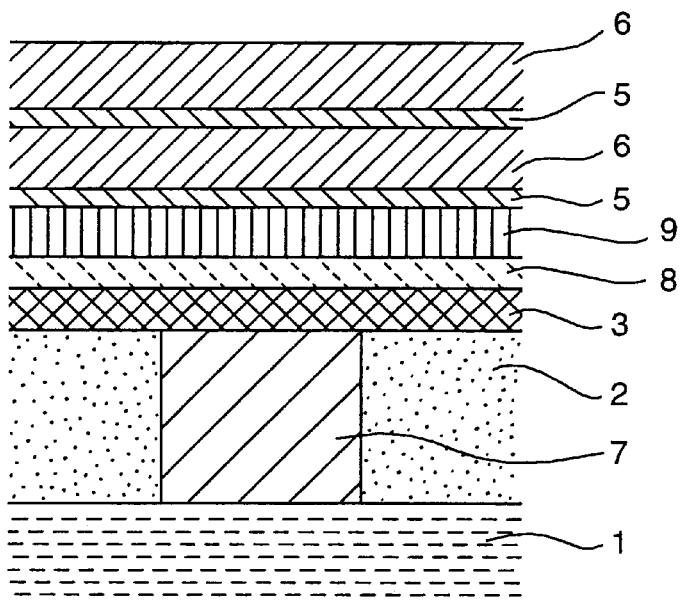
FIG. 9 is a sectional view for describing another embodiment of the present invention with a substrate structure different from FIG. 1 and FIG. 8.

This seventh example is described with reference to FIG. 9. As depicted in FIG. 9, a layer 9 of conductive-oxide forming metal is formed on the uppermost surface of the substrate on which the Bi layer structured ferroelectric thin film is to be formed on the surface of the oxide buffer layer 5 containing Bi. In this example, Ru (ruthenium) served as a conductive-oxide forming metal 9. Besides ruthenium, the conductive oxide forming metal 9 which can be used may be Ir or the like.

In this seventh example, the following steps were carried out in order to electrically connect the uppermost surface of the substrate to the Si substrate 1. First, the Si oxide layer 2 of $SiO_2$ was formed on the Si substrate 1. After a contact hole was formed in the Si oxide film 2, a diffusion layer was formed. The contact hole was filled with polycrystalline Si 7.

Then, this polycrystalline Si 7 was etched by an etch back technique. On an exposed surface, Ti as the lower electrode adhesive layer 3, TiN layer 8, and Ru formed as the conductive oxide forming metal 9 were successively deposited by sputtering to 20 nm, 50 nm, and 50 nm thickness, respectively.

In this example, the highest temperature of the heat treatment in oxygen atmosphere was 650° C. Thus, diffusion of oxygen from the surface inwards is prevented in the TiN layer 8 and the Ru layer as the conductive oxide forming metal 9. Therefore, the surface of the polycrystalline Si 7 or the TiN layer 8 is not oxidized. It is consequently possible to electrically connect the diffusion layer of the Si substrate 1 to the conductive oxide forming metal 9 of Ru formed on the uppermost surface of the substrate.

The diffusion of Ru towards the inside of the Bi layer structured ferroelectric thin film 6 often becomes a problem when the thin film of the Bi layer structured ferroelectric substance 6 is formed on the surface of the conductive oxide forming metal 9 of Ru. However, such diffusion causes no problem at the temperature of 600° C. at which the SBO buffer layer 5 is crystallized. As a result, the SBO buffer layer 5 serves as a barrier layer against the conductive oxide forming metal 9 of Ru, and thus prevents Ru from diffusing into SBT formed as the Bi layer structured ferroelectric substance 6. Accordingly, the characteristics of the Bi layer structured ferroelectric thin film are not degraded.

The structure in this seventh example had a residual polarization value of 3.8 $\mu C/cm^2$, which approximates that obtained in Example 3.

EXAMPLE 8

Figure 10:
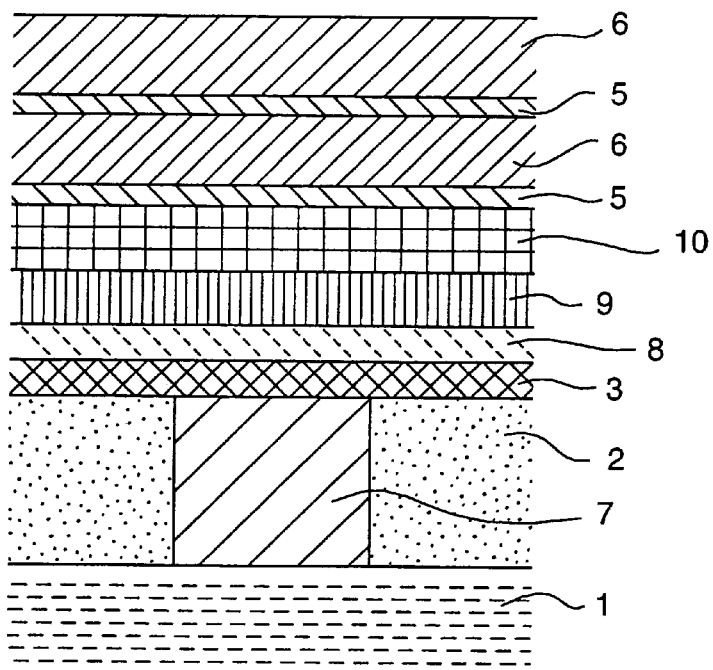
FIG. 10 is a sectional view for describing still another embodiment of the present invention with a substrate structure different from FIG. 1, FIG. 8, and FIG. 9.
Figure 11:
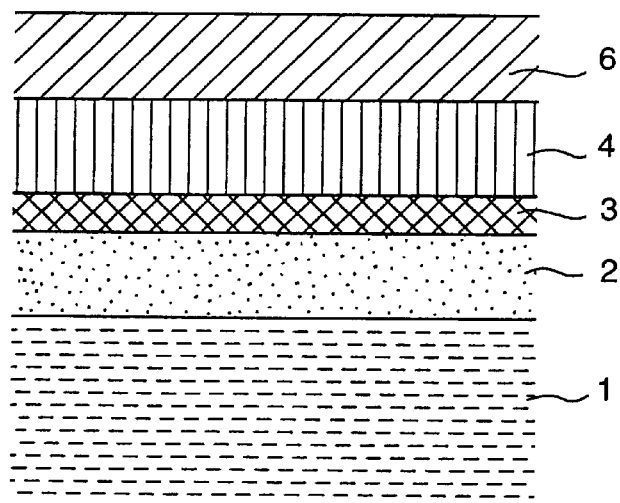
FIG. 11 is a sectional view of a conventional example.

This eighth example is described with reference to FIG. 10. In FIG. 10, a metal oxide layer 10 is formed on the uppermost surface of the substrate on which the Bi layer structured ferroelectric thin film is to be formed on the surface of the oxide buffer layer 5 containing Bi. In this example, ruthenium oxide, "$RuO_2$", served as conductive oxide 10. Besides $RuO_2$, "$IrO_2$" or the like may be used as the conductive oxide 10.

In this example, sputtering was conducted to form Ru, as the conductive oxide forming metal 9, on the uppermost surface of the substrate, as in Example 7. Then a subsequent step was conducted by the use of reactive sputtering to further form "$RuO_2$", as the conductive oxide 10, on the above-mentioned surface.

In this example, diffusion of oxygen is prevented in the TiN layer 8 and the $RuO_2$ layer, as in Example 7. Further, the SBO buffer layer 5 serves as a barrier layer against Ru and thus prevents Ru from diffusing into SBT formed as the Bi layer structured ferroelectric substance 6. Accordingly, the characteristics of the Bi layer structured ferroelectric thin film are not degraded.

The structure in this example had a residual polarization value of 3.7 $\mu C/cm^2$, which approximates that obtained in Example 3.

In Table 1, values of experimental measurements of Examples 1–8 are listed for comparison with the conventional example ("Ref") with respect to materials, production methods, and characteristics.

contacted with the buffer layer containing Bi, the reaction of Pt with Bi can be suppressed because the above-mentioned temperature is lower than about 730° C., at which a Bi—Pt compound is formed.

TABLE 1

| Example | 1 | 2 | 3 | 4 | 5 | 6 | 7 | 8 | Ref |
|---|---|---|---|---|---|---|---|---|---|
| Substrate | Pt/Ti | Pt/Ti | Pt/Ti | Pt/Ti | Pt/Ti | Pt/Ti | Ru | $RuO_2$ | Pt/Ti |
| Buffer layer | SBO | SBO | SBO | SBO | BIT | BIT | SBO | SBO | — |
| Buffer layer producing method | MOD | MOD | MOD | MOD | MOD | SP | MOD | MOD | — |
| Buffer layer preparation temperature (° C.) | 600/700 | 700 | 600 | 600 | 600 | 600 | 600 | 600 | — |
| Thickness of buffer layer (nm) | 60 | 4 | 4 | 2 | 14 | 10 | 4 | 4 | — |
| Bi layer structured ferroelectric substance | SBT | SBT | SBT | SBT | SBT | SBT | SBT | SBT | SBT |
| Producing method of Bi layer structured ferroelectric substance | MOD | MOD | MOD | SP | MOD | MOD | MOD | MOD | MOD |
| Residual polarization ($\mu C/cm^2$)@5 V | 0 | 4.2 | 4.0 | 5.1 | 4.5 | 4.0 | 3.8 | 3.7 | 0.5 |
| Leak current density ($A/cm^2$)@5 V | — | 1E-7 | 1E-7 | 4E-7 | 3E-7 | 2E-7 | 4E-7 | 4E-7 | 3E-7 |

In the foregoing description, SBO or BIT and SBT are used as the buffer layer and the Bi layer structured ferroelectric substance, respectively. It will be noted that a similar effect can be achieved by using $BiTaO_4$ as the buffer layer, and $SrBi_2Nb_2O_9$, $SrBi_2(Nb_1Ta_1)O_9$, $(Sr_{0.9}Pb_{0.1})Bi_2Ta_2O_9$, or $(Sr_{0.9}Ba_{0.1})Bi_2Ta_2O_9$ as the Bi layer structured ferroelectric substance.

As a method of forming thin films of the buffer layer and the Bi layer structured ferroelectric layer, use may be made of CVD (chemical vapor deposition), or laser ablation, instead of the MOD method and sputtering. Further, although the crystallization temperature of the buffer layer is 600° C. or 700° C. in the examples described above, it has been confirmed that a similar effect can be achieved by steps of thermally decomposing the organic components after applying the buffer layer, thereafter forming the Bi layer structured ferroelectric thin film, and crystallizing the buffer layer when the Bi layer structured ferroelectric substance is subjected to the crystallization heat treatment.

As described above, the following effects can be achieved according to the present invention.

As a first effect, it is possible to suppress deviation in composition of the Bi layer structured ferroelectric thin film and to avoid degradation in characteristics.

Specifically, the buffer layer formed by the oxide thin film containing Bi is placed on the surface of the substrate and the Bi layer structured ferroelectric substance is deposited on the upper surface of the buffer layer, then to be crystallized. With this structure, Bi contained in the above-mentioned buffer layer serves as a supply source compensating a lack of Bi within the Bi layer structured ferroelectric thin film arising from reaction of Bi with the precious metal of the lower electrode, which is located at a surface part during crystallization, or with the adhesive layer, or with the thermally oxidized Si underneath. Thus, crystallization of the Bi layer structured ferroelectric substance is promoted while deviation in composition is suppressed. Moreover, the buffer layer is crystallized at a temperature not higher than 700° C. Therefore, in a case where the Pt layer is directly As a second effect, the crystallization of the Bi layer structured ferroelectric thin film progresses at a lower temperature, which brings about the first effect.

Specifically, the buffer layer and the Bi layer structured ferroelectric substance used for the Bi layer structured ferroelectric thin film are similar to each other in composition and structure. Therefore, the buffer layer acts as nucleation sites for crystallization of the Bi layer structured ferroelectric substance. This is effective to enhance the crystallization of the Bi layer structured ferroelectric thin film at a lower temperature and to form the fine grain structure.

As a third effect, it is possible to minimize or avoid degradation of electrical characteristics required in a capacitor. The reason is because the buffer layer has a thickness not greater than five percent of that of the Bi layer structured ferroelectric thin film and can be used in a capacitor. Furthermore, the constituent elements of the buffer layer are partially similar to the constituent elements of the Bi layer structured ferroelectric substance. Therefore, during the formation of the Bi layer structured ferroelectric thin film, the buffer layer can be crystallized into the Bi layer structured ferroelectric thin film after the buffer layer finishes its role.

As a fourth effect, it is possible to prevent failure of electrical connection caused by oxidizing polycrystalline Si. When the deposition temperature is not higher than 650° C., the conductive oxide forming metal or a combination of the conductive oxide and "TiN" can be deposited on polycrystalline Si and serves as a barrier layer against diffusion of oxygen.

The method of the invention may be used alone or in combination with other methods, devices and compositions intended to inhibit or reverse the detrimental effects of hydrogen degradation. The method of the invention is useful to prevent hydrogen degradation regardless of how it is caused. Reducing and other damaging conditions can arise in many circumstances during integrated circuit fabrication; even routine handling of the wafer can result in degradation of electronic properties.

There has been described a method for fabricating ferroelectric integrated circuits that permits exposure to hydrogen and still results in ferroelectric devices with good electrical properties. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiments described, without departing from the inventive concepts. It is also evident that the steps recited may in some instances be performed in a different order; or equivalent structures and processes may be substituted for the various structures and processes described. Consequently, the invention is to be construed as embracing each and every novel feature and novel combination of features present in and/or possessed by the fabrication processes and electronic structures described.

What is claimed is:

1. A method of producing a Bi layer structured ferroelectric thin film, comprising steps of:
   providing a substrate;
   forming a buffer layer of an oxide thin film containing Bi (bismuth) on said substrate; and
   thereafter forming a thin film of a Bi layer structured ferroelectric substance on said buffer layer, said Bi layer structured ferroelectric substance represented by a chemical formula $(Bi_2O_2)^{2+}(A_mB_nO_l)^{2-}$, characterized in that said buffer layer comprises a substance represented by a formula selected from the group consisting of $Bi_4Ti_3O_{12}$ and $A_xBi_yO_z$, in which x, y, and z are values that balance the electrical valences in said $A_xBi_yO_z$.

2. A method of producing a Bi layer structured ferroelectric thin film as in claim 1, wherein said steps of forming a buffer layer and of thereafter forming a thin film of a Bi layer structured ferroelectric substance on said buffer layer are conducted more than one time.

3. A method of producing a Bi layer structured ferroelectric thin film as in claim 1, wherein said buffer layer has a thickness not greater than about five percent of a total combined thickness of a layer structure containing said Bi layer structured ferroelectric thin film and said buffer layer.

4. A method of producing a Bi layer structured ferroelectric thin film as in claim 1, wherein a preparation temperature of said buffer layer is lower than a preparation temperature of said Bi layer structured ferroelectric thin film.

5. A method of producing a Bi layer structured ferroelectric thin film as in claim 1, wherein a preparation temperature of said Bi layer structured ferroelectric thin film is not higher than about 650° C.

6. A method of producing a Bi layer structured ferroelectric thin film as in claim 1, characterized in that said buffer layer contains only elements that are also constituent elements of said Bi layer structured ferroelectric substance.

7. A method of producing a Bi layer structured ferroelectric thin film as in claim 1, characterized in that said constituent element A is selected from a group consisting of a combination of Sr (strontium) and Ba (barium) and a combination of Sr and Pb (lead); and said constituent element B is at least one selected from the group consisting of Ta (tantalum) and Nb (niobium).

8. A method of producing a Bi layer structured ferroelectric thin film as in claim 7, characterized in that said buffer layer comprises strontium bismuth oxide having a chemical formula $Sr_3Bi_2O_6$.

9. A method of producing a Bi layer structured ferroelectric thin film as in claim 1, characterized in that said step of forming a buffer layer comprises a substep of crystallization annealing said buffer layer at a temperature in a range of from 600° C. to 700° C.

* * * * *